United States Patent [19]

Long et al.

[11] 4,138,186
[45] Feb. 6, 1979

[54] TEST APPARATUS

[75] Inventors: Everett J. Long, Claremont; Elmer W. Muench, Covina, both of Calif.

[73] Assignee: Everett/Charles, Inc., Pomona, Calif.

[21] Appl. No.: 851,847

[22] Filed: Nov. 16, 1977

Related U.S. Application Data

[63] Continuation-in-part of Ser. No. 818,206, Jul. 22, 1977, Pat. No. 4,108,528, which is a continuation of Ser. No. 747,611, Dec. 6, 1976, abandoned.

[51] Int. Cl.² .................................................. H01R 3/04
[52] U.S. Cl. ......................... 339/117 P; 324/158 P; 339/18 R; 339/59 M; 339/143 R
[58] Field of Search ............. 339/117 P, 117 R, 18 R, 339/59 M, 143 R; 324/158 P, 158 R, 73 R

[56] References Cited

U.S. PATENT DOCUMENTS

| | | | |
|---|---|---|---|
| 3,016,489 | 1/1962 | Briggs et al. | 324/158 R |
| 3,401,369 | 9/1968 | Palmateer et al. | 339/143 R X |
| 3,405,361 | 10/1968 | Kattner et al. | 324/158 R |
| 3,596,228 | 7/1971 | Reed et al. | 339/59 M |
| 3,757,219 | 9/1973 | Aksu | 324/158 P X |

Primary Examiner—Roy Lake
Assistant Examiner—DeWalden W. Jones
Attorney, Agent, or Firm—Christie, Parker & Hale

[57] ABSTRACT

An apparatus for making electrical contact with plural test points on one of two oppositely facing sides of a planar test member. A test member support has a test member test location. A door is provided for opening and closing access to the test location. The door and support form, when the door is closed, a substantially closed cavity therebetween encompassing the test location. The door and the support each comprise one of two opposing walls of the cavity. An array of relatively spaced electrically conductive probes are mounted in and extend through the wall of the support. Each of the probes has an end exposed exterior to the cavity and a probe head electrically connected on the opposite end which is exposed in the cavity. The probe heads are each resiliently biased away from the wall of the support to a substantially common plane and are movable under pressure towards the wall of the support. The door includes a resilient seal extending around the perimeter of the cavity, between the wall of the door and the support, when the door is closed to thereby form a seal for the cavity and resiliently mount the wall of the door with respect to the support. A vacuum port extends through the support to the cavity. The wall of the door is operable, responsive to vacuum applied in the cavity, for deforming the resilient seal applying a substantially uniform pressure against a side of the test member and thereby applying pressure through the test member to the probe heads. The probe heads move under the pressure until all probe heads make electrical contact with the test member.

18 Claims, 15 Drawing Figures

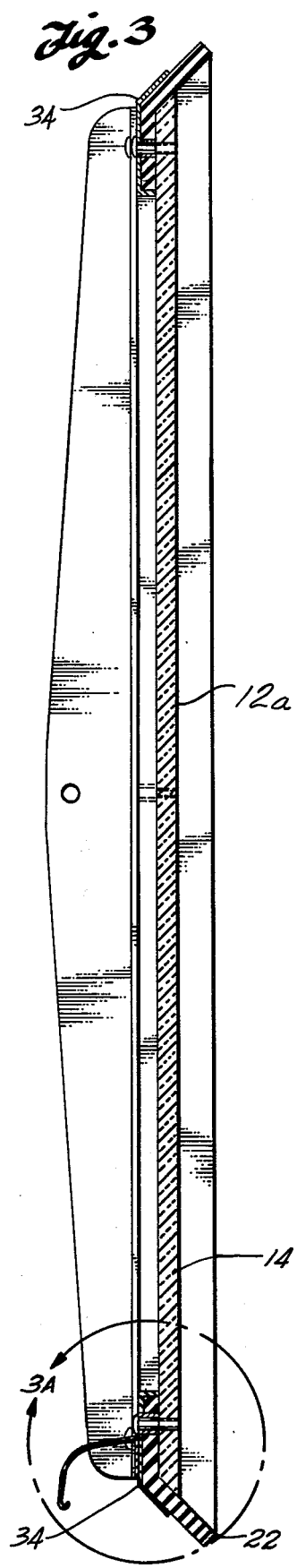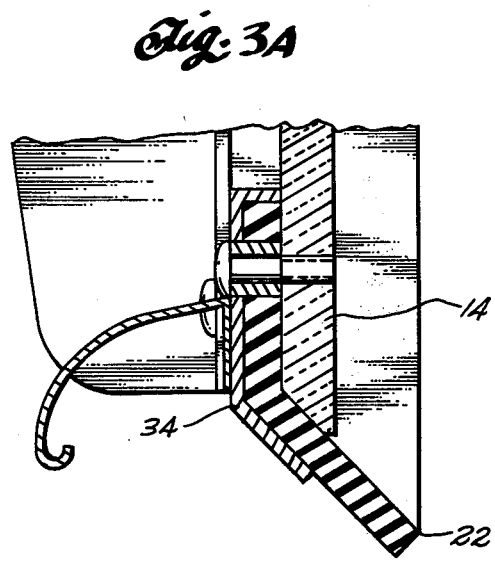

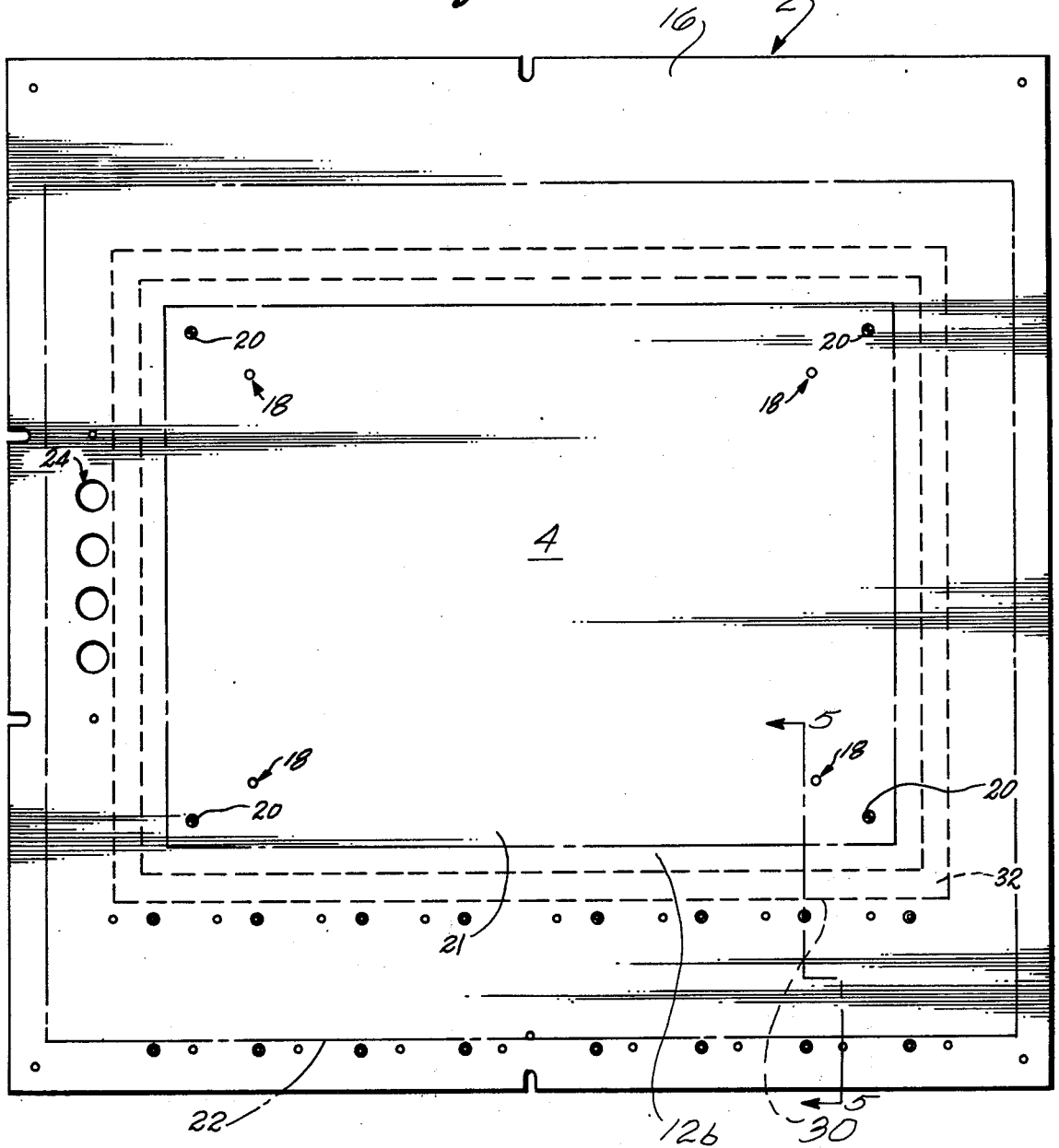

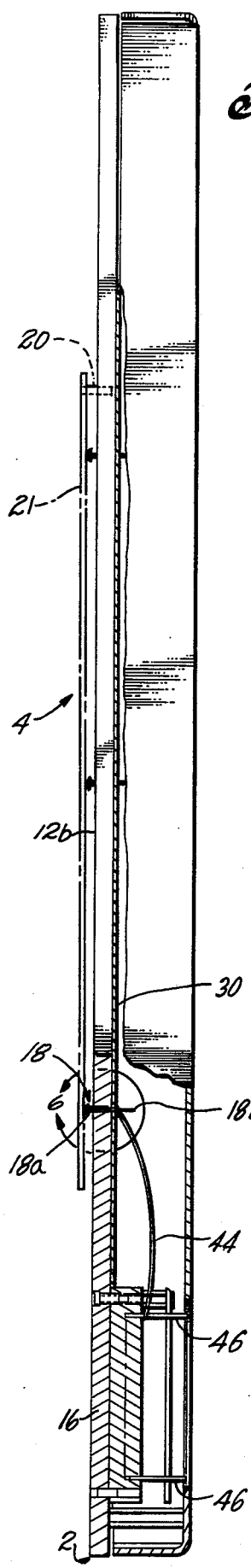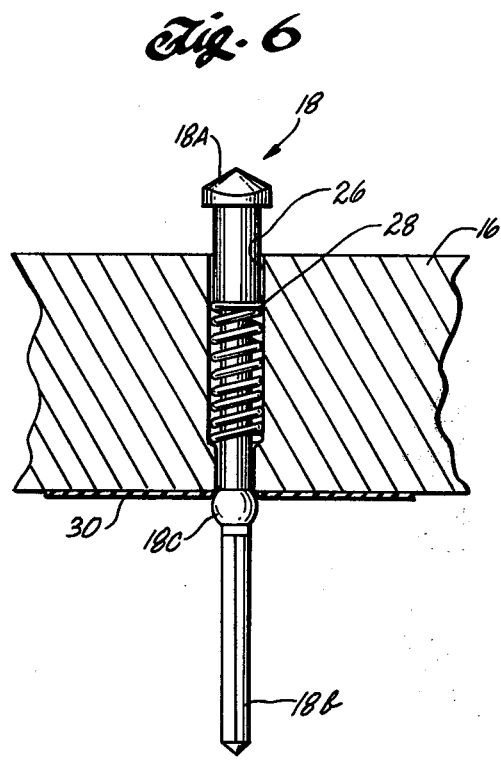

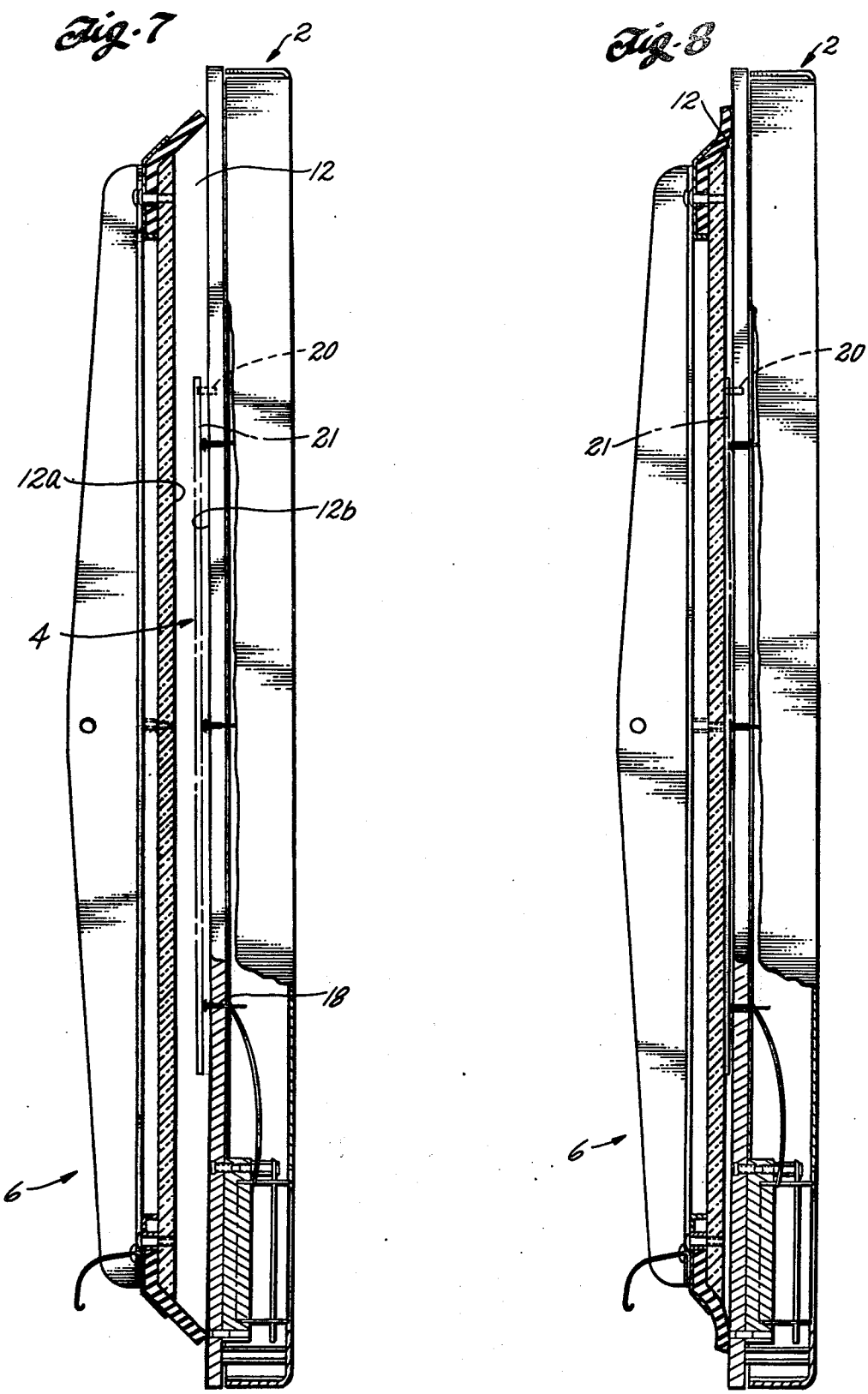

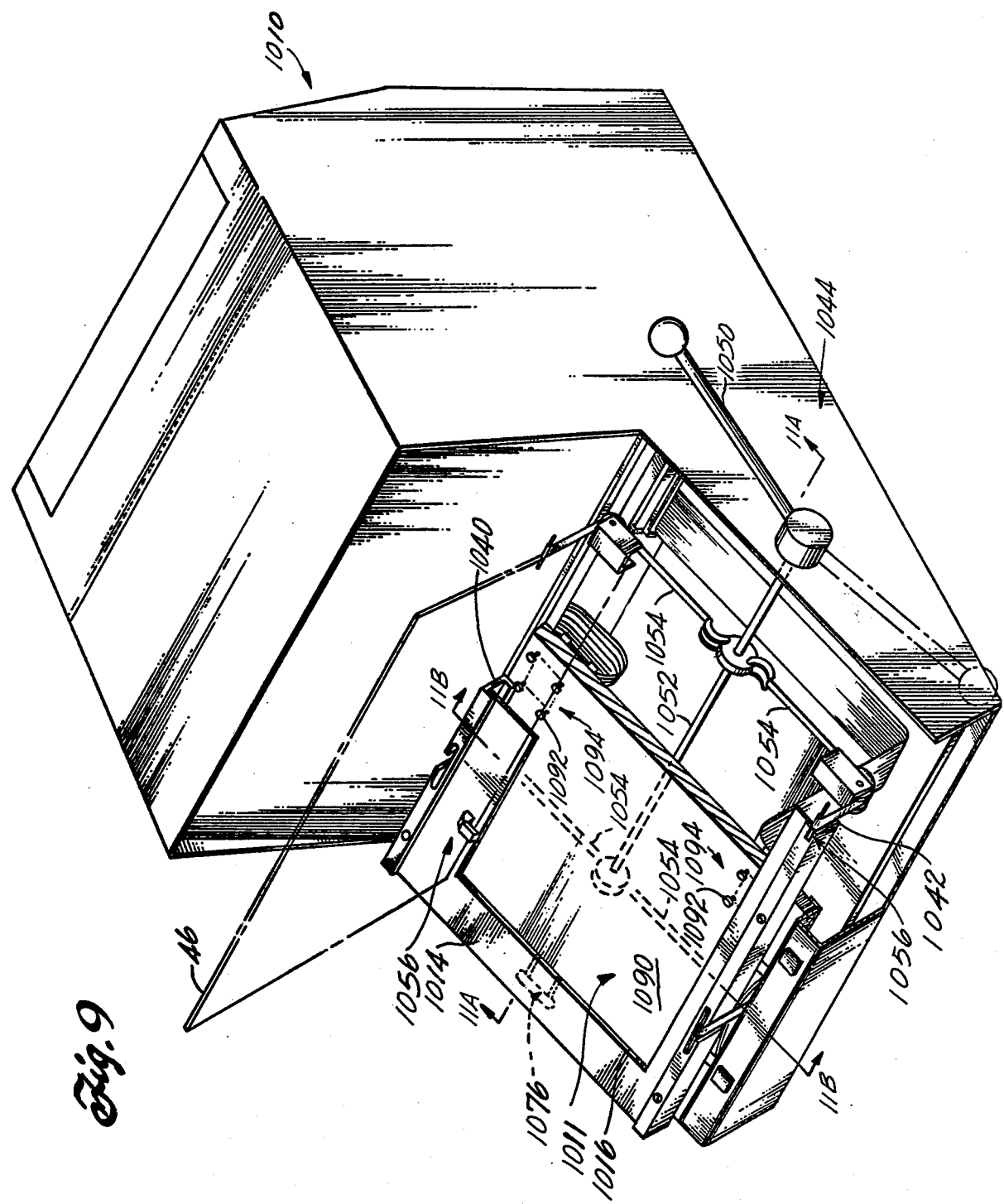

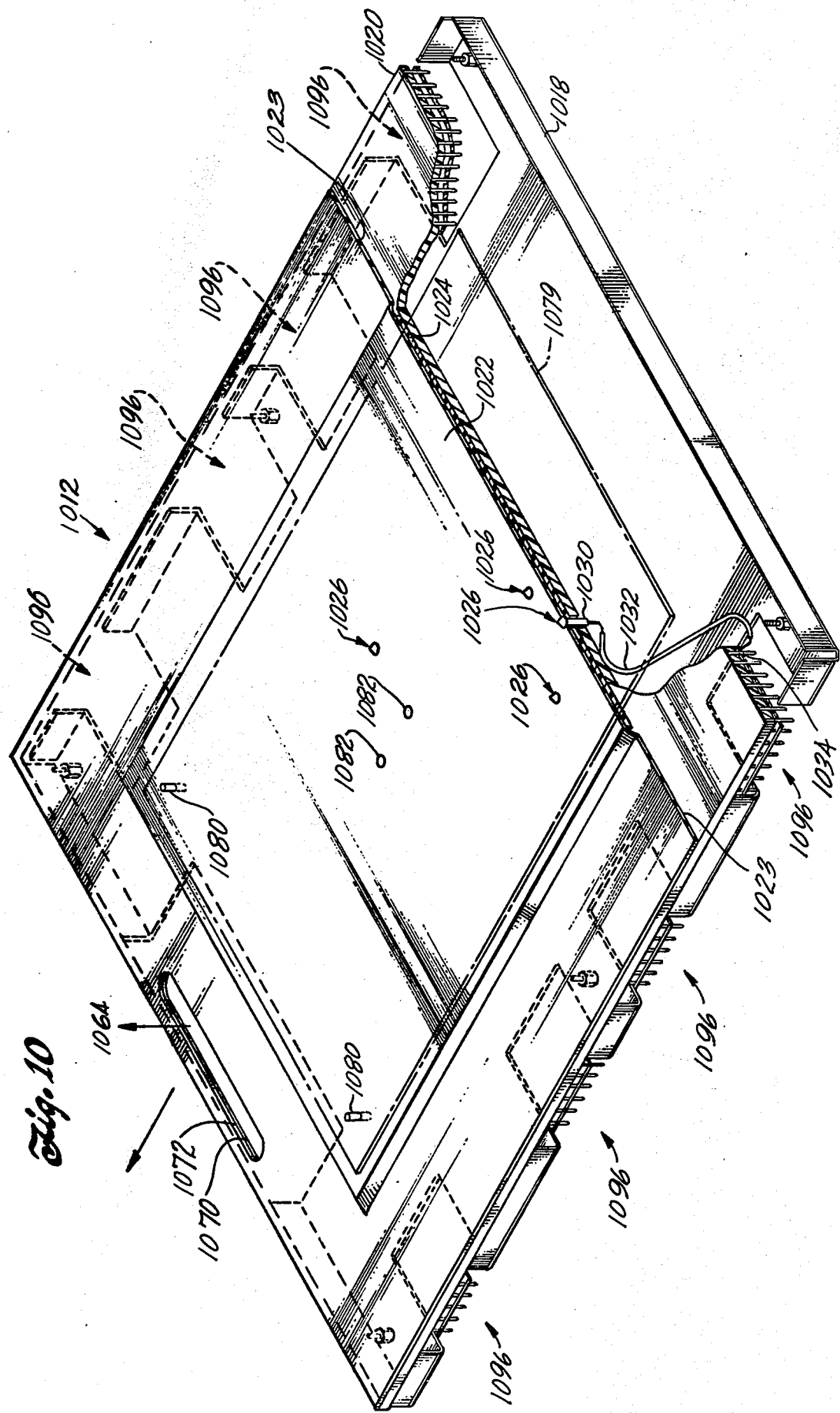

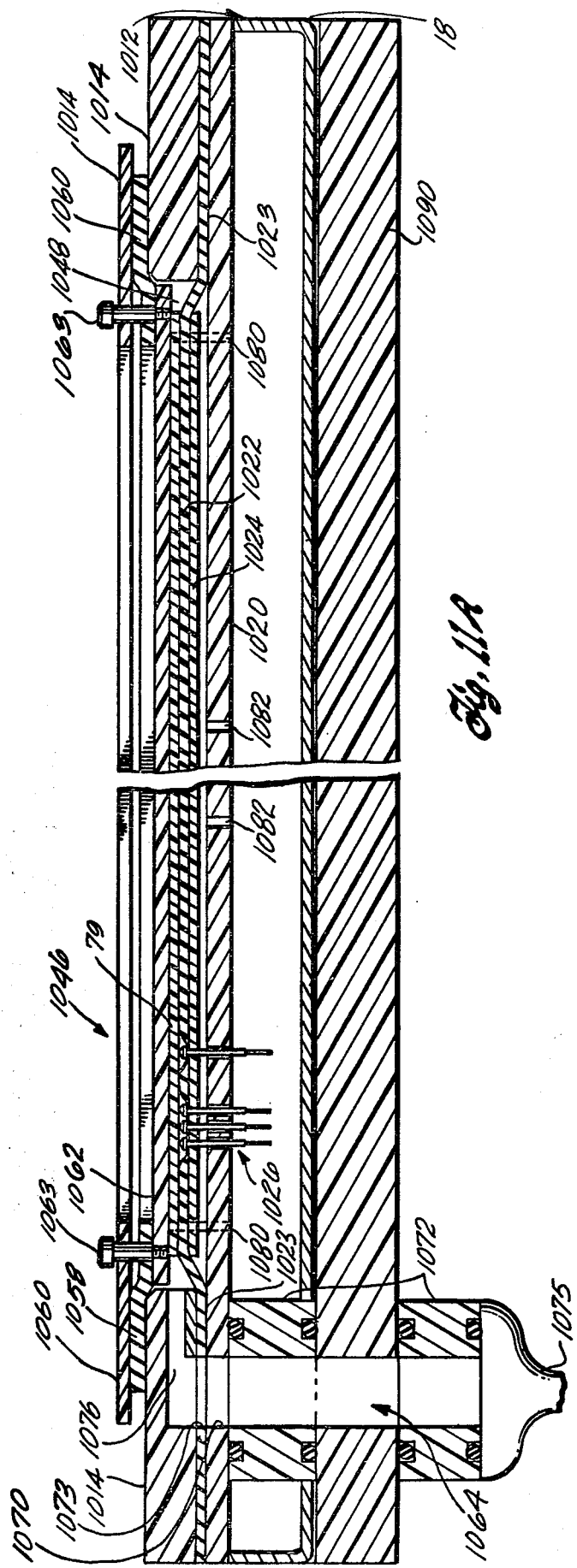

TEST APPARATUS

CROSS REFERENCED RELATED APPLICATIONS

This patent application is a continuation-in-part of U.S. patent application Ser. No. 818,206 filed July 22, 1977 titled PROBE ACTUATOR ASSEMBLY, now U.S. Pat. No. 4,108,528, which in turn is a continuation of the earlier filed application Ser. No. 747,611 filed Dec. 6, 1976 titled PROBE ACTUATOR ASSEMBLY, now abandoned.

BACKGROUND OF THE INVENTION

This invention relates to apparatus for actuating a plurality of probes and a generally planar test member into electrical contact.

Circuit board verifiers are generally known employing an actuator assembly for relatively moving a plurality of electrical test probes and a circuit board, bearing test points, into electrical contact.

The probes are generally elongated, having a probe head at one end for making electrical contact with a test point on the circuit board and an opposite end electrically connected to a test device such as a circuit board analyzer. Continuity and lack of continuity between the various test points on the circuit board are detected by the analyzer through the probes for use in determining if the circuit board is proper or defective.

Various approaches have been utilized for bringing the array of probes and the circuit board under test into engagement. One class of these devices is vacuum actuated. FIG. 12 schematically depicts a cross-sectional view of such a device with the left hand side of the device broken away for simplicity. Referring to FIG. 12, an array of telescoping spring probes are mounted in a fixed backing member 302. One such probe is depicted by way of example at 306. The fixed backing member 302 is generally a rectangular shaped plate which is fixed within a picture frame shaped housing 308.

A stiff backing member 312 of generally the same shape as the fixed backing member 302 is flexibly mounted over the fixed backing member 302 by a spring 314. A diaphragm or sealing member 315 is mounted on the opposite side of the stiff backing member from the fixed backing member. The sealing member is generally rectangular in shape and is fixed around the edge thereof in the picture frame shaped housing 308. A hole is cut through the sealing member 315 and the stiff backing member 312 in alignment with each probe, one such hole 316 being depicted in alignment with probe 306. The circuit board to be tested is depicted at 318 where it is aligned with respect to the probes. A hinged door 320 has a recess into which the circuit board 318 extends allowing a lower sealing edge 320a of the door to form a seal against the sealing member completely around the circuit board. As a result, a vacuum chamber 322 is formed between the door and the fixed backing member and the housing 308. In operation the vacuum chamber 322 is evacuated through port 324 extending through housing 308, drawing the door, the sealing member, the circuit board, and the stiff backing member in the direction of the probes until the probe heads make electrical contact with test points on the circuit board. The probes are electrically connected by wiring to one of a set of interface pins 307 which in turn are connected by an interface assembly to a data processing apparatus for analyzing the electrical connection for the circuit board through the probes.

Another prior art device which is similar to that depicted in FIG. 12 but eliminates the door is useful for testing a circuit board which does not have holes and can form its own seal against the sealing member. An example of such a circuit board is one where the holes have been filled in by component leads and solder.

Other arrangements have been made for bringing an array of probes and a circuit board together for test. For example, a movable platen has been used for engaging a circuit board with an array of spaced contact probes. However, such arrangements are generally slow and costly.

SUMMARY OF THE INVENTION

An embodiment of the present invention is an apparatus for making electrical contact with plural test points on one of two oppositely facing sides of a planar test member. A test member support has a test member test location. A door is provided for opening and closing access to the test location. The door and support form, when the door is closed, a substantially closed cavity therebetween encompassing the test location. The door and the support each comprise one of two opposing walls of the cavity. An array of relatively spaced electrically conductive probes are mounted in and extend through the wall of the support. Each of the probes has an end exposed exterior to the cavity and a probe head electrically connected on the opposite end which is exposed in the cavity. The probe heads are each resiliently biased away from the wall of the support to a substantially common plane and are movable under pressure towards the wall of the support. The door includes a resilient seal extending around the perimeter of the cavity, between the wall of the door and the support, when the door is closed to thereby form a seal for the cavity and resiliently mount the wall of the door with respect to the support. A vacuum port extends through the support to the cavity. The wall of the door is operable, responsive to vacuum applied in the cavity, for deforming the resilient seal, applying a substantially uniform pressure against a side of the test member and thereby applying pressure through the test member to the probe heads. The probe heads move under the pressure until all probe heads make electrical contact with the test member.

Preferably a sheet of resilient material on one side of the wall of the support forms a seal for the cavity around the perimeter of each of the probes.

With an arrangement according to the invention it is now possible to provide much lower cost probes than the aforementioned telescoping probes. Additionally, the test apparatus embodying the invention is much simpler and less costly to construct.

The present invention is of particular importance in a test apparatus wherein the support member comprises an interchangeable test head. A particular user may require a large number of interchangeable test heads for the various arrays of points for test whereas the rest of the assembly generally remains fixed and only one is needed. To reduce cost to the user the present invention allows the cost of the interchangeable test head to be minimized. This is done by determining those parts which are the same from one array of probes to another, such as the seal, and locating them on other parts of the test apparatus such as the door and substructure.

Preferably the test support member comprises a plate and the resilient seal forms a direct seal against the plate, further simplifying the construction.

Preferably the door comprises a door plate which provides access to the test location on the support plate and the resilient seal is mounted on the door plate and extends in sealing relation between the door plate and the support plate around the perimeter of the test location when the door plate is closed, resulting in an even further simplification of the construction.

Reference is now made to the drawings which show specific operative embodiments of the invention but which are not to be taken as limiting the scope of the invention as defined in the claims.

DRAWINGS

FIG. 3 is a cross-sectional view of the door of FIG. 2 taken along lines 3—3;

FIG. 3A is an enlarged view of the left hand portion of the cross-sectional view of the door depicted in FIG. 3;

FIG. 4 is a plan view of the support for an interchangeable test head which forms a part of the vacuum actuated fixture system of FIG. 1; a printed circuit is indicated in broken line at the test location on the support;

FIG. 5 is a view of the support depicted in FIG. 4 taken from the right hand side of FIG. 4, broken away along the lines 5—5; additionally, a portion of the housing surrounding the support plate is broken away to reveal the edge of the plate;

FIG. 6 is an enlarged section view taken at lines 6—6 in FIG. 5 and depicting the details of a probe;

FIG. 7 is an end view of the support with the door closed after a test member has been located on the probes; the support is shown partially in cross-sectional view similar to that depicted in FIG. 5 and the door is depicted in cross-section similar to that depicted in FIG. 3;

FIG. 8 is an end view of the support and door, similar to that shown in FIG. 7, after vacuum has been applied in the cavity;

FIG. 9 is a pictorial and schematic drawing of a circuit board verifier for practicing the present invention and discloses an alternate embodiment of the invention; the access cover is shown in phantom line to reveal the parts which would otherwise be hidden by the access cover;

FIG. 10 is a diagrammatic view of an interchangeable test head for the circuit board verifier of FIG. 9 partly in cross-section;

FIG. 11A is a section view taken along lines 11A—11A of FIG. 9 illustrating the circuit board verifier with the interchangeable test head in place, the access cover closed, and with the assembly in an actuated condition;

DESCRIPTION

Figure 1:
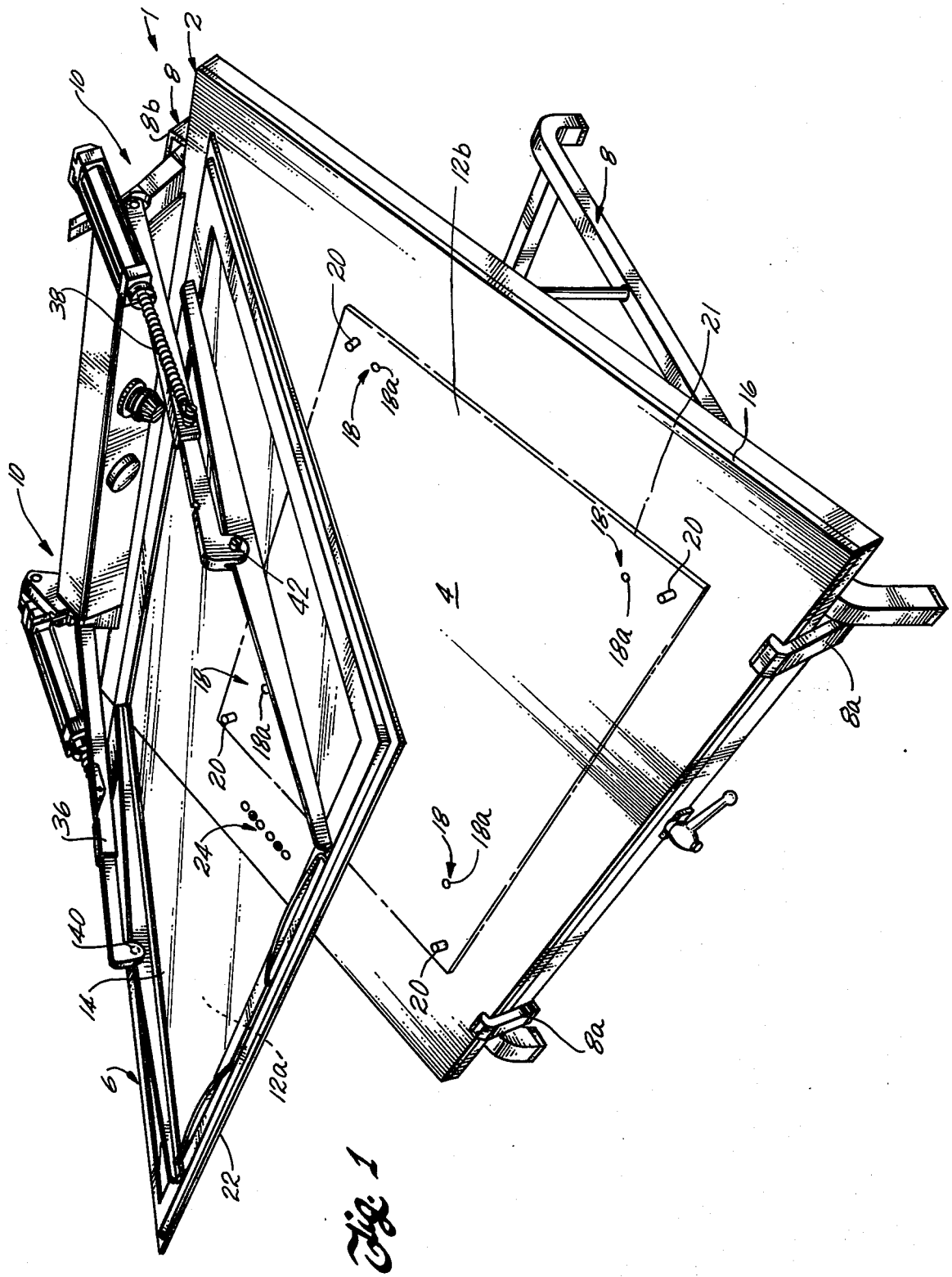
FIG. 1 is a pictorial view of a preferred vacuum actuated fixture system and embodying the present invention; a printed circuit board is depicted by broken lines in a test location.
Figure 2:
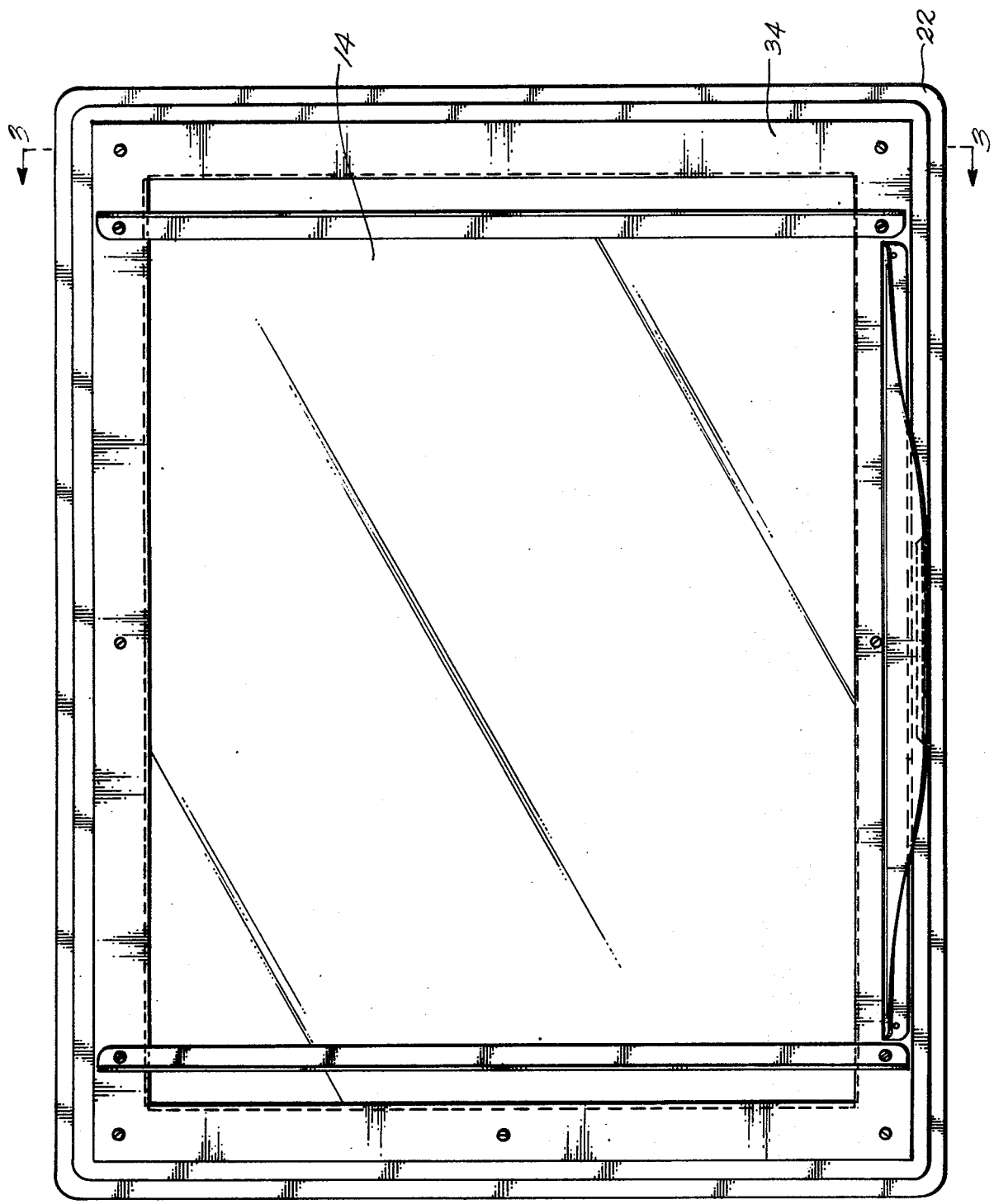
FIG. 2 is a plan view of the door for the vacuum actuated fixture system of FIG. 1 with the supporting arms removed.

FIGS. 1–8 disclose a vacuum actuated fixture system or test apparatus for making electrical contact with test points on a side of a planar test member. Referring to FIG. 1, the test apparatus includes a test member support 2 having a test member test location 4 at which a test member is positioned for test. For purposes of illustration a test member, such as a printed circuit board, is depicted at 21 in dashed lines in the test location.

A door 6 is hinged to a frame 8 by means of hinges 10. The door 6 when open provides access for positioning the test member 21 into the test location 4 and when closed, closes the access to the test location.

The door 6 and the test member support 2 are constructed so that, when the door is closed, they provide a substantially closed cavity 12 as depicted in FIGS. 7 and 8. The cavity 12 encompasses the test location 4.

The door 6 and support 2 form one of two opposing walls 12a and 12b, respectively, of the cavity 12. In this regard, the door includes a door plate 14 and the support 2 includes head plate 16 and, when the door is closed, the walls 12a and 12b are in opposition to each other. Preferably the head plate and support plate are made of an electrical insulating material. By way of example, the door plate is a thin transparent synthetic resin and the support plate is linen base phenolic.

To be explained in more detail, the wall 12a of the door is moved when vacuum is applied in the cavity 12, when the door is closed, in a direction normal to the wall 12b of the support.

An array 17 of relatively spaced apart electrically conductive probes 18 are mounted in and extend through the wall 12b of the support. The probes 18 are arranged in an array which corresponds to the desired points of contact on the test member under test. Only four probes are depicted in FIG. 1 for simplicity. As depicted in detail in FIGS. 5 and 6, each of the probes 18 comprises an end 18b exposed exterior to the cavity 12 and a probe head 18a electrically connected on the opposite end of the probe. Each probe head 18a is exposed in the cavity 12 (FIGS. 7 and 8).

The probe heads 18a are resiliently biased away from the support wall to a substantially common plane. Preferably the probe heads are exposed so as to directly contact a side of a test member as it is positioned in the test location 4 when the door 6 is open. By way of illustration, a substantially rectangular and planar test member 21 is illustrated by broken line at test location 4 in FIG. 5 as would occur when the door is open. The probe heads 18a are movable, under pressure, towards the wall 12b of the support.

Four locator pins 20 form locator means on the support 2 for directly locating a side of the test member 21 in direct contact with the exposed probe heads 18a when the door is open. The locator pins 20 extend normal away from the head plate 16. Test members such as printed circuit boards are commonly provided with locator holes which align with and extend around the locator pins 20. As a result the locator pins are adapted for guiding the test member positioned thereon toward and away from the support wall and prevent movement of the test member transversely to the probes, thereby precisely aligning the test points on the test member with respect to the array of probes. Although four locator pins are shown by way of example, less than four may be employed. Also, other locating means may be used to fix the test member on fixed x-y coordinates relative to the support plate as is well known in the art. The locator means such as the pins 20 must not interfere with the movement of the door.

Referring to FIGS. 1, 2, 3 and 3A, the door 6 comprises a resilient seal 22. The seal 22 forms a vacuum seal for the cavity 12 completely around the perimeter of the cavity, between the wall of the door and the support, when the door is closed.

Vacuum ports 24 extend through the support to the cavity 12, allowing vacuum to be applied in the cavity. A vacuum fixture, not shown, is mounted on the support and is connected to the ports external to the cavity for applying vacuum.

The seal 22 is affixed to the door plate and also forms a resilient support for the door plate 14 on the support when the door is closed. As a result the door plate 14 is operable responsive to vacuum applied in the cavity for deforming the seal 22 so that the door plate moves in the direction of the support, thereby applying a substantially uniform pressure against a side of the test member, located by the locating means or pins 20. The resiliently biased probe heads move down as a result of the pressure of the test member until all probe heads make electrical contact with the test member as depicted in FIG. 8.

Referring to FIG. 6 the probes 18 extend through holes 26 extending through the head plate 16. A spiral compression spring 28 extends between a shoulder on the head plate and a facing shoulder on the probe 18, thereby providing the resilient biasing of the probe and thereby the probe head 18a. A shoulder ring 18c is machined on the probe 18 and limits the travel of the probe under the urging of the spring 28.

Due to the clearance between the probes 18 and the holes 26, significant amounts of air may pass through the head plate 16 when vacuum is applied and it is important to prevent the escape of air. Accordingly, seal means is provided for sealing the cavity around each of the probes. To this end, a sheet of resilient material 30, preferably rubber, is affixed to the lower side of the head plate 16, and the probes 18 extend through the resilient material. The resilient material forms a tight seal around the perimeter of each probe 18 as depicted in FIG. 6. In order to assemble the probes on the support plate and to ensure a tight seal between the resilient material 30 and the probes, the probes are forced through the holes 26 and then pierce the rubber sheet while resting the rubber sheet on a sheet of rigid permeable material.

Although the resilient sheet of material 30 may be affixed to the head plate 16 in a number of ways well known in the art, preferably a strip of double sided tape 32 extends between the lower side of head plate 16 and the resilient material 30 around the outer perimeter of the resilient material 30, thereby affixing the resilient material 30 to the lower side of the head plate 16. The double sided tape 32 is depicted between the dashed lines in FIG. 4.

Refer now to the door in more detail as depicted in FIGS. 1, 2, 3 and 3A. The door plate 14 is substantially rectangular in shape although other shapes may be devised within the scope of the present invention. The seal 22 is affixed to and sealed to the door plate 14 around the perimeter of the door plate and, when the door is closed, it extends around the perimeter of the test location 4. To this end the resilient seal 22 is bonded on the upper surface of the head plate 16 and is held in place by a rectangular picture frame shaped bracket 34 which extends around the perimeter of the door plate 14.

Significantly, the resilient seal 22 extends outward from the door plate 14 and, when the door is closed, in the direction of the head plate 16. As a result, the resilient seal 22 resiliently mounts the door plate 14 on the head plate 16. Thus, preferably the seal performs not only the function of sealing the cavity but of resiliently mounting the door plate with respect to the head plate.

To ensure that the door 6 is free to evenly orient the seal 22 on the head plate 16 completely around the perimeter of the cavity, arms 36 and 38 extend from the hinges 10, and pivots 40 and 42 pivotally mount the door to the arms 36 and 38, respectively.

In operation, the door 6 is opened to the position depicted in FIG. 1 and a planar test member, such as a printed circuit board, is positioned with its locator holes over the locator pins 20 in direct contact with the probe heads 18 as depicted in FIG. 5 and then the door 6 is closed as depicted in FIG. 7. At this point the test member is positioned over the heads of the probes and in direct electrical contact therewith and the resilient seal 22 is in direct contact with the head plate 16 of the support 2 and in sealing engagement completely around the perimeter of the cavity. The resilient seal 22 holds the door plate 14 away from the test member. Also the perimeter of the door and seal extends around the other side of the ports 24 and the test member as indicated by broken lines 22 in FIG. 4.

Vacuum is then applied to the cavity through the ports 24, drawing the door plate 14 towards the head plate 16, causing the resilient seal 22 to deform and collapse, and allow the door plate 14 to apply pressure evenly over the adjacent side of the test member, causing the test member to in turn apply pressure against the resiliently biased probe heads until the probe heads are compressed. Although not essential to the invention, the door plate 14 may deform somewhat due to the irregularities in the surface of the test member. The pressure is sufficient so that all, or at least a portion of, the probe heads bottom out against the head plate 16. This condition is depicted in FIG. 8.

It should be noted that where no circuit board is present or on areas of a board where no probes may be present, pads made of rubber or other suitable material may be used to maintain nominal and acceptable levels of deformation of the lid as well as to provide flow paths across the entire cavity to ensure adequate evacuation.

The test member support 2 forms an interchangeable test head which can be removed from and inserted into the frame 8. FIGS. 4 and 5 depict the interchangeable test head or support 2 removed from the frame. To this end the frame 8 is expandable (by means not shown) between the front 8a and the back 8b allowing the interchangeable test head to be lifted out and removed from the frame. Also each probe 18 is connected to a separate one of a number of interface pins 46 which in turn are connected (by means not shown) to a circuit tester (also not shown). For purposes of illustration, FIG. 5 illustrates only one of the probes 18 connected by a conductor 44 to one of the interface pins 46 and only two interface pins are shown, the other interface pins being indicated by broken line.

Refer now to the embodiment of the invention depicted in FIGS. 9, 10, 11A, 11B and 12. A circuit board verifier or tester 1010 is shown for making electrical contact between an array of probes and a plurality of generally planar test points on a test member. Electronic circuitry, displays and other items (not shown) are employed for verifying continuity and the lack of continuity between various test points on a circuit board under test.

A cavity 1011 is provided for receiving the interchangeable test head 1012 depicted in FIG. 10. The cavity 1011 is surrounded by a rectangular frame 1014 providing a rectangular opening 1016. FIG. 9 shows the right hand portions of the frame 1014 and an interface plate 1090 broken away to reveal the underneath portions of the tester. The interchangeable test head 1012 (FIG. 10) is inserted into the verifier from the right hand side depicted in FIG. 9.

Before considering the remainder of the portions of the verifier depicted in FIG. 9, consider the details of the interchangeable test head 1012 of FIG. 10. The interchangeable test head 1012 includes a rigid head plate 1020 (FIG. 10) on which is mounted a door or cover 1018. The head plate 1020 is preferably made of a rigid insulating material such as phenolic, is rectangular and extends to the ends of the cover 1018.

A diaphragm member 1022, of a resilient material such as neoprene, is provided and, although the shape is not essential to the present invention, has a rectangular shape of substantially the same size as the head plate 1020. A rectangular shaped backup plate 1024 is affixed to the diaphragm 1022. The backup plate 1024 has a substantially planar surface adjacent the diaphragm. The backup plate 1024 is preferably made of a semi-rigid insulating material and is preferably affixed over its entire surface by cement or other means to the adjacent surface of the diaphragm 1022.

The diaphragm member 1022 is affixed by cement or other means to the head plate 1020 at 1023, completely around the perimeter of the backup plate 1024. The flexibility of the diaphragm around the perimeter of the backup plate allows the diaphragm and the backup plate to be forced away from the head plate 1020 towards a test member responsive to the creation of vacuum in the chamber above the diaphragm. The flexibility and resiliency of the diaphragm around the perimeter of the backup plate draws the diaphragm and the backup plate away from the test member towards the head plate upon restoration of atmospheric pressure in the chamber.

Figure 11B:
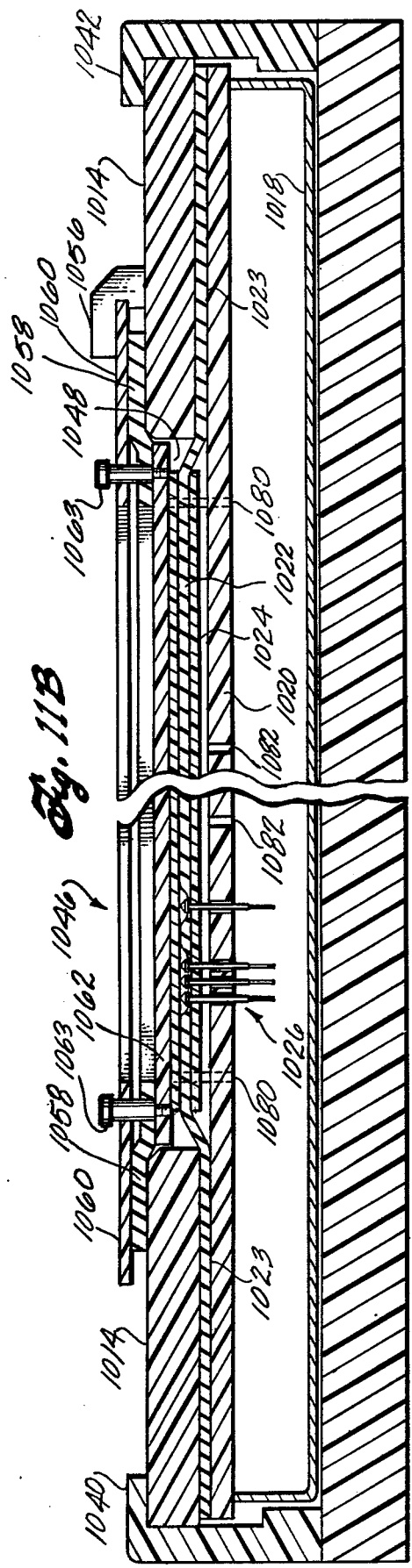
FIG. 11B is a section view taken along lines 11B—11B of FIG. 9 illustrating the circuit board verifier with the interchangeable test head in place, the access cover closed, and with the assembly in an actuated condition.
Figure 11C:
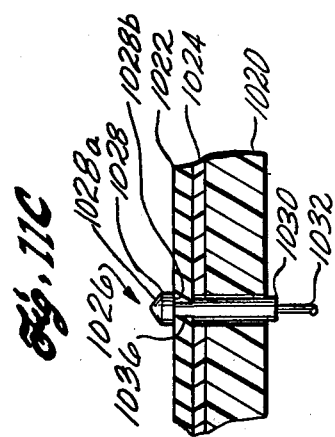
FIG. 11C is an enlarged section view of a portion of the diaphragm, the backup plate and the head plate and showing the mounting of a probe.
Figure 12:
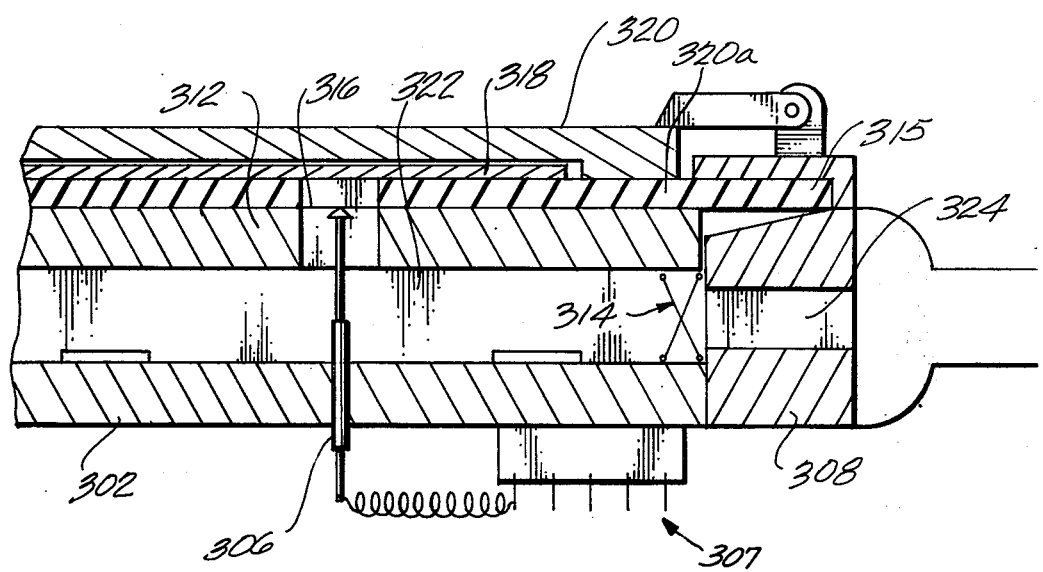
FIG. 12 is a partially schematic cross-sectional view of a portion of a prior art test apparatus.

An array of probes 1026 are mounted on the diaphragm, as shown in more detail in FIG. 11C, so that they are carried with the movement of the diaphragm. Although other materials may be used, each probe 1026 is formed of a conductive metal material, is preferably round in cross-section, and is elongated. Each probe has a probe head 1028 having, oppositely facing, a contact side 1028a and a bearing side 1028b. A conductor extends from the bearing side 1028b of the probe head 1028 to an opposite end 1030 which is affixed by way of soldering, crimping, wire wrapping, or other means well known in the art, to a wire 1032 which in turn is connected to a corresponding interface pin 1034 as depicted in FIG. 10. One interface pin 1034 is provided for each of the probes 1026 with a separate wire connection therebetween. The head plate and backup plate are nonconductive and have clearance holes through which the conductive probes 1026 extend as depicted in FIG. 11C. Additionally, the clearance holes in the head plate serve as a guide for the probes.

Each of the probes has an annular recess 1036 behind the head 1028 into which the diaphragm 1022 extends. The recess 1036, along with the closely surrounding diaphragm 1022, captures and holds the probes 1026 in its axial position with the diaphragm in engagement with the bearing side 1028b. With this arrangement the diaphragm carries each probe 1026 as the backup plate and diaphragm move relative to the head plate 1020.

Referring to FIGS. 9 and 11B, the test head cavity 1011 in addition to the rectangular frame 1014 has U-shaped test head guide rails 1040 and 1042 positioned on the upper and lower opposite sides of the rectangular frame member 1014 as seen in FIG. 9. The interchangeable test head of FIG. 10 slides into the test head guide rails 1040 and 1042 from the right hand end as seen in FIG. 9. By way of example, the interchangeable test head is inserted in the direction of the arrow depicted in FIG. 10. When the interchangeable test head is fully positioned to the left in FIG. 9, a test head lockdown mechanism 1044 is actuated, causing a seal between the diaphragm 1022 and the underneath side of the rectangular frame member 1014 and around the manifold passage 1064, as depicted in the section view of FIG. 11A. As a result when the access cover 1046 (depicted by phantom line in FIG. 9 and shown in cross-section in FIGS. 11A and 11B) is closed, a sealed chamber 1048 is formed between the access cover 1046 and the interchangeable test head 1012.

Although the details thereof are not essential to the present invention, the test head lockdown mechanism 1044 includes a lever arm 1050 connected to a rotatable shaft 1052 which in turn is connected to pulldown straps 1054. The pulldown straps 1054 are hooked into the test head guide rails 1040 and 1042. As a result, rotation of the arm 1050 counter-clockwise to the position depicted by phantom line in FIG. 9 causes the straps 1054 to draw the test head guide rails 1040 and 1042 and hence the rectangular frame 1014 downward until the lower surface of the rectangular frame 1014 engages and seals against the upper surface of the neoprene diaphragm 1022 and around the manifold passage 1064.

Refer now to the construction of the access cover 1046 as depicted in cross-section in FIGS. 11A and 11B. The access cover 1046 is pivoted by means of two hinges 1056 (only one being shown in FIGS. 9 and 10) to the frame 1014. The hinges 1056 are conventional hinges the details of which are not important to the present invention.

The access cover 1046 includes a carrier frame 1060. Although not essential to the present invention, the carrier frame 1060 has an essentially rectangular picture frame type construction. A neoprene gasket 1058 is bonded to an access plate 1062. The gasket 1058 is generally of the same shape as the carrier frame 1060. The access plate 1062 has a substantially planar surface facing into the chamber 1048 and has a rectangular outer perimeter which is slightly larger than the opening in the carrier frame 1060 and the gasket 1058. Stripper bolts 1063 have one end connected into the access plate 1062 and extend through clearance holes in the carrier frame 1060 which guide the access plate 1062 away from and towards the carrier frame 1060 during actuation and deactuation. With this construction the access cover 1046 may be rotated away from and into a closed position with respect to the chamber 1048 and, when in a closed position, the gasket 1058 forms an air-tight seal with the rectangular frame 1014 thereby completing the closed chamber 1048.

Passage 1064 extends into the chamber 1048 and includes an opening through manifolds 1072 attached to the interface plate 1090, opening 1070 in the head plate 1020, opening 1073 in the diaphragm 1022 and an L-shaped passage portion 1076 formed in the rectangular frame 1014. A conduit 1075 is connected to the passage 1064 and vacuum applied in the conduit 1075 is used to draw a vacuum through the passage 1064 in the chamber 1048 between the diaphragm 1022 and the access cover 1046, drawing the access plate 1062 and the diaphragm 1022 relatively closer together. It should be noted that assembly of FIGS. 11A and 11B are shown in the actuated condition wherein vacuum has been applied.

Consider briefly the operation of the circuit board verifier. Initially the interchangeable test head 1012 is inserted into the circuit verifier between the test head guide rails 1040 and 1042, and the lever arm 1050 of the test head lockdown mechanism 1044 is actuated causing the diaphragm 1022 to seal against the underside of the rectangular frame 1014, thereby forming a lower wall of the chamber 1048. With the access cover 1046 open, a test member with planar test points such as a printed circuit board 1079, is positioned with its locator holes over locator pins 1080. In this manner the circuit board 1079 is located at a precise location for test in proper orientation relative to the probe heads. Subsequently the access cover 1046 is rotated to the closed position depicted in FIGS. 11A and 11B with the gasket 1058 in engagement with the rectangular frame 1014. In this manner the access cover 1046 forms the upper wall of the closed chamber 1048, with the rectangular frame member 1014 forming side walls between the upper and lower walls. At this step in the operation the neoprene gasket 1058 and the diaphragm 1022, respectively, are drawing the access plate 1062 and probes 1026 away from the printed circuit board 1079 as compared with the condition depicted in FIGS. 11A and 11B.

The chamber 1048 and the passage 1064 form a means for applying a force through the backup plate 1024 and the resilient diaphragm 1022 to the bearing sides of the probe heads, forcing the contact sides of the probe heads in the direction of the circuit board 1079. Specifically, vacuum is applied through the conduit 1075 and the passage 1064 to the closed chamber 1048, forming a pressure differential between the inside and outside of the chamber 1048 and forcing the backup plate 1024 and resilient diaphragm 1022 to apply pressure to the bearing sides of the probe heads. As a result, the probe heads are forced tightly against the test points on the circuit board 1079. The resilient diaphragm 1022 deforms under the pressure exerted by the backup plate 1024, ensuring that the contact surfaces of all of the probe heads tightly engage their respective test points on the printed circuit board 1079 as depicted in FIGS. 11A and 11B.

A difference in pressure is also applied across the diaphragm formed by the gasket 1058 and access plate 1062, drawing the same against the printed circuit board 1079, applying a force to the printed circuit board 1079 in opposition to the force of the probe heads as depicted in FIGS. 11A and 11B. Since the access plate 1062 is substantially rigid and planar, it maintains the printed circuit board 1079 in a substantially planar condition.

Preferably the backup plate is harder than and substantially stiffer, or more rigid, than the diaphragm but is sufficiently flexible so that as vacuum is applied, the pressure on the backup plate forces the backup plate to substantially conform to the surface contour of the printed circuit board in the pressurized condition. Any remaining irregularity between the surface contour of the backup plate and printed circuit board will be compensated for by resiliency of the diaphragm so that all probe heads will be in contact with the printed circuit board.

With such an arrangement the test member or printed circuit board can be rigid or flexible and in the latter case will conform to the planar surface of the access cover plate 1062 under the pressurized condition.

In one embodiment the backup plate 1024 is 1/32 inch thick, the diaphragm 1022 is 1/16 inch thick and the access plate 1062 is ⅛ inch thick. The Shore hardness of the diaphragm is between 20 and 30 and that of the backup plate is Rockwell M100.

Preferably the access plate 1062 is made from an insulating material such as polystyrene or phenolic so that a double sided printed circuit board can be tested without shorting the conductors adjacent the access plate.

The plate 1020 is solid. Therefore, vent holes 1082 are provided through the plate 1020 to the backup plate 1024 to allow atmospheric pressure to exist at the bottom side of the backup plate 1024 and the diaphragm 1022 so that as vacuum is applied in the chamber 1048, the diaphragm and the backup plate are forced by atmospheric pressure towards the circuit board 1079.

The interface plate 1090 (FIG. 9) is located below the test head guide rails 1040 and 1042. Referring to FIG. 10, the interchangeable test head has eight groups 1096 or interface pins 1034, each interface pin 1034 as discussed above being connected to one of the probes 1026. Each of the pins 1034 is connected to the rest of the electrical circuitry (not shown) in circuit board verifier 1010 through a separate telescoping spring probe 1092 (FIG. 9). Thus, for each of the wire wrap pins 1034 there is a corresponding spring probe 1092 on the interface plate 1090 which makes electrical contact with the end of such wire wrap pin 1034 when the assembly composed of the rectangular frame 1014 and the test head guide rails 1040 and 1042 is drawn down by counter-clockwise movement of the handle 1050.

Only two of the spring probes 1092 are depicted in FIG. 9 for simplicity.

Briefly then, what has been disclosed is a test apparatus for making electrical contact with plural test points on at least one of two oppositely facing sides of a planar test member. A test member support comprises the head plate 1020, diaphragm member 1022, backup member 1024 and frame 1014. The test member support includes a location for a test member as depicted at 1079 in FIG. 10. A door is provided in the form of access cover 1046 for opening and closing access to the test location. The door and support comprise, when the door is closed, a substantially closed cavity, i.e., sealed chamber 1048. The door and support each comprise one of two opposing walls of the cavity and the wall on the door, including access plate 1062, is movable under pressure in a direction towards the wall of the support when the door is closed.

An array of relatively spaced electrically conductive probes are depicted at 1026 and extend through the walls of the support. Each of the probes has an end exposed exterior to the cavity and a probe head, electrically connected on the opposite end, which is exposed in the cavity. The probe heads are each resiliently biased away from the wall of the support by the diaphragm member 1022. The probe heads are each resiliently biased to a substantially common plane wherein all the probe heads are exposed so as to contact a side of a test member as it is positioned in the test location when the door is open. The probe heads are movable under pressure towards the wall of the support.

Locator pins 1080 form locator means on the support for directly locating one of the sides of a test member in direct contact with the exposed probe heads when the door is open. The door includes a resilient seal in the form of a gasket 1058 which forms a vacuum seal for the cavity around the perimeter of the cavity between the door and the support when the door is closed.

Passage 1064 forms a vacuum port through the support to the cavity. The wall of the door is operable responsive to vacuum applied in the cavity for moving towards the wall of the support, thereby applying a substantially uniform pressure against a side of a test member, located by the locator means. The probe heads are thereby moved under the pressure applied to the test member until all probe heads make electrical contact with the test member.

It should further be noted that the diaphragm member 1022 forms means for sealing the cavity around the perimeter of each of the probes.

Although exemplary embodiments of the invention have been disclosed for purposes of illustration, it will be understood that various changes, modifications and substitutions may be incorporated into such embodiments without departing from the spirit of the invention as defined by the claims appearing hereinafter.

What is claimed:

1. Test apparatus for making electrical contact with plural test points on at least one of two oppositely facing sides of a planar test member comprising:
   a test member support having a test location;
   a door for opening and closing access to the test location;
   the door and support comprising, when the door is closed, a substantially closed cavity therebetween encompassing the test location, the door and the support each comprising one of two opposing walls of said cavity;
   an array of relatively spaced electrically conductive probes mounted in and extending through the wall of the support, each of said probes comprising an end exposed exterior to the cavity and a probe head electrically connected on the opposite end which is exposed in the cavity, said probe heads each being resiliently biased away from the wall of the support to a substantially common plane and movable under pressure towards the wall of the support;
   locator means on the support for locating such test member in the test location, said locator means being adapted for guiding a location test member toward and away from the wall of the support; and
   a vacuum port through the support to the cavity;
   said door comprising a resilient seal extending around the perimeter of the cavity between the wall of the door and the support, when the door is closed, to thereby form a seal for the cavity and resiliently mount the wall of the door with respect to the support;
   the wall of the door being operable response to vacuum applied in the cavity for deforming the resilient seal and applying a substantially uniform pressure against a side of such test member, located by the locating means, and thereby apply pressure through such a test member to the probe heads, the probe heads moving under the pressure applied thereto until all probe heads make electrical contact with such a test member.

2. Test apparatus according to claim 1 comprising means for sealing the cavity around the probes.

3. Test apparatus according to claim 2 wherein the sealing means comprises a sheet of resilient material affixed on one side of the support wall and tightly sealing around the perimeter of each of said probes.

4. Test apparatus according to claim 1 wherein the door wall comprises a substantially planar member.

5. Test apparatus according to claim 4 wherein the wall of the support is substantially planar and wherein said resilient seal forms a seal against the wall of the support when the door is closed.

6. Test apparatus according to claim 4 wherein said resilient seal is flared outwardly from the cavity around the perimeter of the cavity so that when vacuum is applied in the cavity the resilient seal draws a tight seal against the wall of the support.

7. Test apparatus according to claim 1 wherein the locator means directly locates such a test member in direct contact with the probe heads when the door is open.

8. Test apparatus for making electrical contact with plural test points on at least one of two oppositely facing sides of a planar test member comprising:
   a test support plate having a test member test location;
   a door for opening and closing access to the test location;
   the door and support plate comprising, when the door is closed, a substantially closed cavity therebetween encompassing the test location, the door and the support plate each comprising one of two opposing walls of the cavity;
   an array of relatively spaced electrically conductive probes mounted in and extending through the support plate at the test location, each of the probes comprising an end exposed exterior to the cavity and a probe head electrically connected on the opposite end which is exposed in the cavity, the probe heads being resiliently biased away from the support plate to a substantially common plane wherein all of the probe heads are exposed so as to contact a side of such a test member being positioned at the test location when the door is open, the probe heads being movable under pressure towards the support plate;
   locator means on the support plate for directly locating one of the sides of the test member in direct contact with such exposed probe heads when the door is open, the locator means being adapted for guiding a located test member towards and away from the support plate;
   the door comprising thereon a resilient seal for forming a vacuum seal for the cavity, around the perimeter of the cavity, between the door and the support plate when the door is closed and for resiliently mounting the door wall for movement relative to the support plate; and
   a vacuum port through the support to the cavity;

the wall of the door being operable, responsive to vacuum applied in the cavity, for moving in the direction of the support plate thereby deforming the resilient seal and applying a substantially uniform pressure against a side of such a test member, located by the locating means, and thereby apply pressure through the test member to the probe heads, the probe heads thereby moving under the pressure thereon until all probe heads make electrical contact with such a test member.

9. Test apparatus according to claim 8 comprising means for sealing the cavity around the probes.

10. Test apparatus according to claim 9 wherein the sealing means comprises a sheet of resilient material affixed on one side of the support plate and tightly sealing around the perimeter of each of said probes.

11. Test apparatus according to claim 8 wherein the wall of the door comprises a plate to which the seal is affixed.

12. Test apparatus according to claim 8 wherein the resilient seal is flared outwardly from the cavity, around the perimeter of the cavity, so that when vacuum is applied in the cavity the seal draws tightly against the support plate for sealing the cavity.

13. Test apparatus according to claim 11 wherein vacuum in the cavity causes the door plate to apply pressure on such test member and the probe heads move until at least some of the probe heads engage the support plate to limit the movement of the test member.

14. Test apparatus for making electrical contact with plural test points on at least one of two oppositely facing sides of a planar test member, comprising:
a base plate and a door mounted for movement relative to the base plate between an open condition, for receipt of such a test member, and a closed condition;
the door comprising a plate opposed to the base plate when the door is closed and a resilient seal affixed on said door plate, the resilient seal extending between the cover plate and the base plate around the perimeter of a test position for such a test member and adapted for resiliently mounting the cover plate for movement relative to the base plate when the door is closed;
a substantially fluid tight cavity in said test apparatus including such position for the test member and comprising as walls the door plate, the base plate, and the resilient seal;
a plurality of conductive probes extending through said base plate and each comprising a probe head exposed in the cavity and movable toward and away from the base plate;
means for resiliently biasing the probe heads away from the base plate; and
means for forming a vacuum in the cavity, when the cover is closed, for drawing the cover plate in the direction of the base plate, the resilient seal deforming under the pressure to permit the cover plate to be so drawn, thereby causing the probe heads and the base plate to apply forces on opposite sides of such a test member in the cavity, the resiliently biased probe heads adjusting to irregularities, if any, in such a test member until all said probe heads are in electrical contact with such test member.

15. Test apparatus according to claim 14 comprising locator means for directly locating a side of such a test member in direct contact with the exposed probe heads when the door is open.

16. Test apparatus for a planar test member comprising:
a test member support plate;
a movably mounted door plate providing access to a test location on the support plate;
a resilient seal mounted on the door plate and extending in sealing relation between the door plate and support plate around the perimeter of the test location when the door plate is closed so as to form a resilient mounting for the door plate on the support plate, the sealing relation between the seal and support plate being broken when the door plate is open;
a substantially sealed cavity including the test location and comprising the support plate, the door plate, and the seal;
a plurality of probes extending through the support plate and comprising resiliently biased probe heads exposed in the cavity; and
a port for vacuum to the cavity.

17. Test apparatus according to claim 16 comprising locator means for directly locating a side of a test member in direct contact with the probe heads when the door plate is open.

18. Test apparatus according to claim 16 comprising means for pivotally mounting the door plate in the test apparatus so that the door plate is free to orient the resilient seal with respect to the support plate.

* * * * *

UNITED STATES PATENT AND TRADEMARK OFFICE
CERTIFICATE OF CORRECTION

PATENT NO. : 4,138,186

DATED : February 6, 1979

INVENTOR(S) : Everet J. Long et al.

It is certified that error appears in the above-identified patent and that said Letters Patent are hereby corrected as shown below:

Column 5, line 45, "to" should read -- on --.

Column 10, line 36, "or" should read -- of --.

Column 11, line 60, "location" should read -- located --.

Signed and Sealed this

Seventh Day of August 1979

[SEAL]

*Attest:*

*Attesting Officer*

LUTRELLE F. PARKER
*Acting Commissioner of Patents and Trademarks*

UNITED STATES PATENT AND TRADEMARK OFFICE
CERTIFICATE OF CORRECTION

PATENT NO. : 4,138,186
DATED : Feb. 6, 1979
INVENTOR(S) : Everett J. Long et al.

It is certified that error appears in the above-identified patent and that said Letters Patent are hereby corrected as shown below:

Column 13, line 41, "cover" should be -- door --;
line 43, "cover" should be -- door --.

Signed and Sealed this

Twenty-third Day of October 1979

[SEAL]

Attest:

RUTH C. MASON
Attesting Officer

LUTRELLE F. PARKER
Acting Commissioner of Patents and Trademarks